United States Patent
Seto

(10) Patent No.: US 12,471,395 B2
(45) Date of Patent: Nov. 11, 2025

(54) PHOTOELECTRIC CONVERSION DEVICE AND LIGHT EMITTING DEVICE

(71) Applicant: CANON KABUSHIKI KAISHA, Tokyo (JP)

(72) Inventor: Daichi Seto, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 551 days.

(21) Appl. No.: 18/047,382

(22) Filed: Oct. 18, 2022

(65) Prior Publication Data

US 2023/0154943 A1     May 18, 2023

(30) Foreign Application Priority Data

Nov. 12, 2021  (JP) .................................. 2021-184890

(51) Int. Cl.
*H10F 39/00* (2025.01)

(52) U.S. Cl.
CPC .................................. *H10F 39/802* (2025.01)

(58) Field of Classification Search
CPC ........ H10F 39/802; H10F 39/12; H10F 39/18; H10F 39/199; H10F 39/803; H10F 39/8037; H10F 39/80373; H10F 39/811; H10F 39/813; H10F 39/80
USPC .......................................................... 257/292
See application file for complete search history.

(56) References Cited

U.S. PATENT DOCUMENTS

| | | | |
|---|---|---|---|
| 6,177,968 B1 * | 1/2001 | Okada | G02F 1/141 349/172 |
| 10,818,715 B2 | 10/2020 | Iwata | |
| 11,094,731 B2 | 8/2021 | Seto | |
| 11,121,160 B2 | 9/2021 | Suzuki | |
| 11,430,827 B2 | 8/2022 | Seto | |
| 2015/0206920 A1 | 7/2015 | Yamamoto et al. | |

(Continued)

FOREIGN PATENT DOCUMENTS

| | | |
|---|---|---|
| JP | 2002-134728 A | 5/2002 |
| JP | 2008-147284 A | 6/2008 |

(Continued)

OTHER PUBLICATIONS

Japanese Office Action issued Aug. 8, 2023 during prosecution of related Japanese application No. 2021-184890 (English-language machine translation included.).

*Primary Examiner* — Duy T Nguyen
*Assistant Examiner* — Jiyoung Oh
(74) *Attorney, Agent, or Firm* — VENABLE LLP

(57) ABSTRACT

A photoelectric conversion device includes a substrate, a photoelectric conversion unit configured to generate charges corresponding to incident light, a floating diffusion portion to which the charges generated by the photoelectric conversion unit are transferred, and a transistor arranged in the substrate, the transistor having a plurality of main electrodes and a gate connected to the floating diffusion portion, the transistor being configured to output a signal corresponding to a potential of the floating diffusion portion from at least one of the plurality of main electrodes. In a plan view with respect to the substrate, the gate has four or more sides. In the plan view, the plurality of main electrodes is adjacent to three or more sides of the gate.

12 Claims, 10 Drawing Sheets

(56) References Cited

U.S. PATENT DOCUMENTS

| | | | |
|---|---|---|---|
| 2016/0099286 A1* | 4/2016 | Yamamoto | H10F 39/151 |
| | | | 438/78 |
| 2017/0201705 A1 | 7/2017 | Hiroaki | |
| 2018/0342207 A1* | 11/2018 | Tsuboi | H10K 50/11 |
| 2020/0083266 A1* | 3/2020 | Nakadate | H10F 39/813 |
| 2022/0059595 A1* | 2/2022 | Honjo | H10F 39/18 |

FOREIGN PATENT DOCUMENTS

| | | |
|---|---|---|
| JP | 2010-98193 A | 4/2010 |
| JP | 2015-138851 A | 7/2015 |
| JP | 2016-5068 A | 1/2016 |
| JP | 2018-200441 A | 12/2018 |
| JP | 2018-207291 A | 12/2018 |
| JP | 2021-97241 A | 6/2021 |

* cited by examiner

PHOTOELECTRIC CONVERSION DEVICE AND LIGHT EMITTING DEVICE

BACKGROUND OF THE INVENTION

Field of the Invention

The present disclosure relates to a photoelectric conversion device and a light emitting device.

Description of the Related Art

Japanese Patent Application Laid-Open No. 2016-5068 discloses a solid-state imaging device including an amplifying transistor for reading out a signal corresponding to a charge accumulated in a photoelectric conversion unit. Japanese Patent Application Laid-Open No. 2016-5068 discloses a technology for realizing high frame rate photographing by connecting a plurality of amplifying transistors in parallel to increase transconductance.

In a device having a transistor, an increase in transconductance of the transistor may be desired to improve performance. As an example of such a method, there is a method of connecting a plurality of transistors in parallel as described in Japanese Patent Application Laid-Open No. 2016-5068, but there are cases where it is not appropriate to apply this method.

SUMMARY OF THE INVENTION

Accordingly, an object of the present disclosure is to provide a photoelectric conversion device and a light emitting device with improved performance.

According to an aspect of the present disclosure, there is provided a photoelectric conversion device including a substrate, a photoelectric conversion unit configured to generate charges corresponding to incident light, a floating diffusion portion to which the charges generated by the photoelectric conversion unit are transferred, and a transistor arranged in the substrate, the transistor having a plurality of main electrodes and a gate connected to the floating diffusion portion, the transistor being configured to output a signal corresponding to a potential of the floating diffusion portion from at least one of the plurality of main electrodes. In a plan view with respect to the substrate, the gate has four or more sides. In the plan view, the plurality of main electrodes is adjacent to three or more sides of the gate.

According to another aspect of the present disclosure, there is provided a light emitting device including a substrate, a light emitting element, and a transistor arranged in the substrate, the transistor having a plurality of main electrodes and a gate, the transistor being configured to supply a current corresponding to a potential of the gate from at least one of the plurality of main electrodes to the light emitting element. In a plan view with respect to the substrate, the gate has four or more sides. In the plan view, the plurality of main electrodes is adjacent to three or more sides of the gate.

Further features of the present invention will become apparent from the following description of exemplary embodiments with reference to the attached drawings.

DESCRIPTION OF THE EMBODIMENTS

Figure 1:
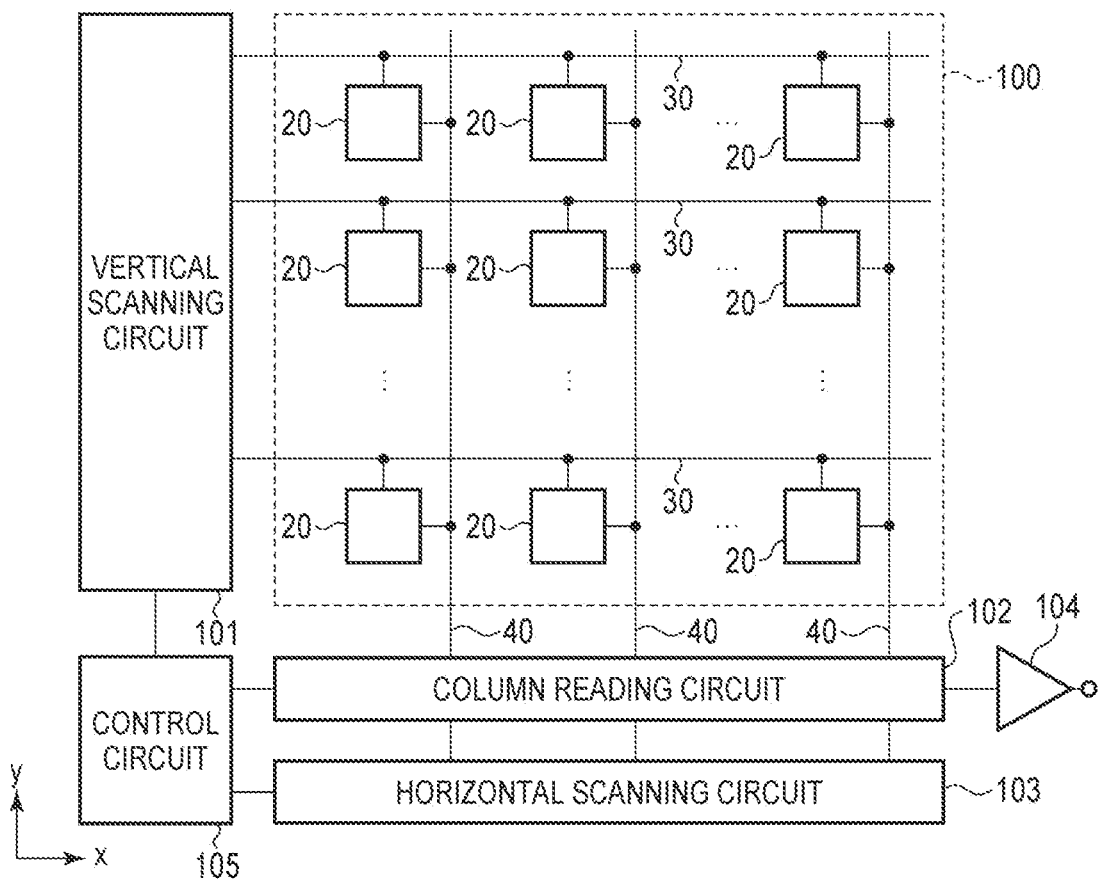
FIG. 1 is a block diagram illustrating a schematic configuration of a photoelectric conversion device according to a first embodiment.

Preferred embodiments of the present invention will now be described in detail in accordance with the accompanying drawings. In the drawings, the same or corresponding elements are denoted by the same reference numerals, and the description thereof may be omitted or simplified.

In first and second embodiments described below, an imaging device will be mainly described as an example of a photoelectric conversion device. However, the photoelectric conversion device of each embodiment is not limited to the imaging device, and can be applied to other devices. Examples of other devices include a ranging device and a photometry device. The ranging device may be, for example, a focus detection device, a distance measuring device using a time-of-flight (TOF), or the like. The photometric device may be a device for measuring an amount of light incident on the device.

First Embodiment

FIG. 1 is a block diagram illustrating a schematic configuration of a photoelectric conversion device according to the present embodiment. The photoelectric conversion device of the present embodiment includes a pixel array 100, a vertical scanning circuit 101, a column reading circuit 102, a horizontal scanning circuit 103, an output circuit 104, and a control circuit 105. The circuit constituting the photoelectric conversion device may be formed in one or a plurality of semiconductor substrates.

The pixel array 100 includes a plurality of pixels 20 arranged in a plurality of rows and a plurality of columns.

Each of the plurality of pixels 20 generates charges by photoelectrically converting incident light and outputs a signal corresponding to the incident light. Microlenses and color filters may be arranged on the pixels 20.

In each row of the pixel array 100, a plurality of control lines 30 are arranged so as to extend in the first direction (x-direction in FIG. 1). Each of the plurality of control lines 30 is connected to the pixels 20 arranged in the first direction, and serves as a signal line common to the pixels 20. The first direction in which the control lines 30 extend may be referred to as a row direction or a horizontal direction. The control lines 30 are connected to the vertical scanning circuit 101.

In each column of the pixel array 100, output lines 40 are arranged so as to extend in a second direction (y-direction in FIG. 1) intersecting with the first direction. Each of the output lines 40 is connected to the pixels 20 arranged in the second direction, and serves as a signal line common to the pixels 20. The second direction in which the output lines 40 extend may be referred to as a column direction or a vertical direction. Each of the output lines 40 is connected to a current source 41, which will be described later with reference to FIG. 2, and the column reading circuit 102.

The control circuit 105 outputs control signals such as a vertical synchronization signal, a horizontal synchronization signal, and a clock signal to the vertical scanning circuit 101, the column reading circuit 102, and the horizontal scanning circuit 103. Thus, the control circuit 105 controls the operation of these circuits.

The vertical scanning circuit 101 is a scanning circuit including logic circuits such as a shift register, a gate circuit, and a buffer circuit. The vertical scanning circuit 101 outputs a control signal to the pixels 20 via the control lines 30 based on a vertical synchronization signal, a horizontal synchronization signal, a clock signal, and the like, and performs scanning for sequentially outputting signals from the pixels 20 on a row basis. The vertical scanning circuit 101 controls a charge accumulation period in the pixels 20.

The signal generated by the pixel 20 is output to the column reading circuit 102 via the output line 40 on a corresponding column. The column reading circuit 102 includes column circuits corresponding to respective columns. The column circuit performs processing such as amplification and AD conversion on the signal input through the output line 40, and holds the processed signal on a column basis.

The horizontal scanning circuit 103 is a scanning circuit including logic circuits such as a shift register, a gate circuit, and a buffer circuit. The horizontal scanning circuit 103 sequentially selects a plurality of column circuits of the column reading circuit 102. Thus, each of the plurality of column circuits sequentially outputs the held signals to the output circuit 104. The output circuit 104 outputs signals to the outside of the photoelectric conversion device in a predetermined format.

Figure 2:
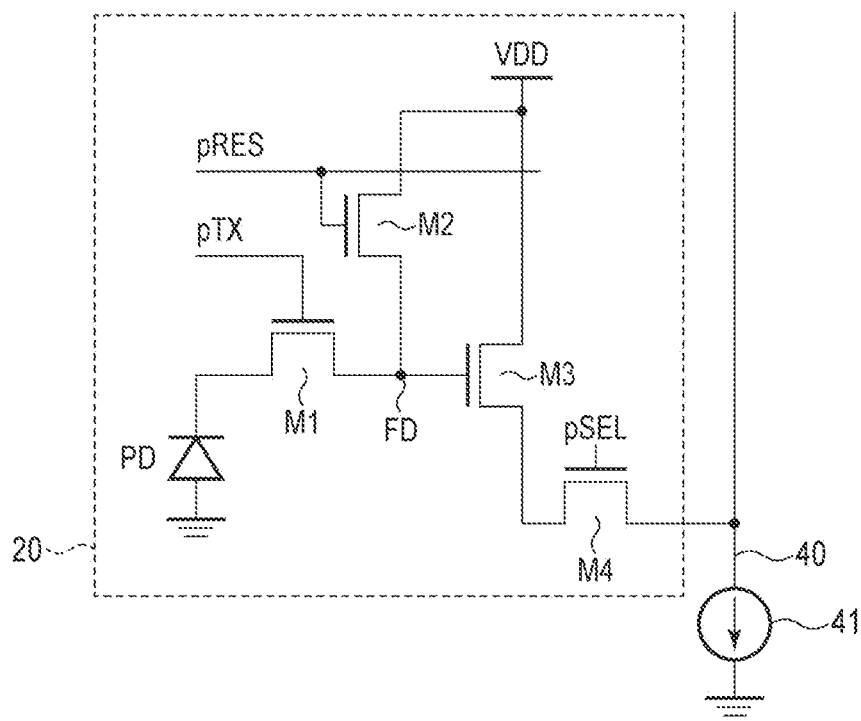
FIG. 2 is an equivalent circuit diagram of a pixel according to the first embodiment.

FIG. 2 is an equivalent circuit diagram of the pixel 20 according to the present embodiment. In the following description, it is assumed that the charges accumulated in the photoelectric conversion unit in the pixel 20 are electrons. All the transistors included in the pixel 20 are N-type MOS transistors. However, the charges accumulated in the photoelectric conversion unit may be holes, and in this case, the transistors in the pixel 20 may be P-type MOS transistors. That is, the conductivity type of the transistors or the like can be changed as appropriate depending on the polarity of charges handled as a signal.

The pixel 20 includes a photoelectric conversion unit PD, a transfer transistor M1, a reset transistor M2, an amplifying transistor M3, and a selection transistor M4. The photoelectric conversion unit PD is, for example, a photodiode. The anode of the photoelectric conversion unit PD is connected to a ground node, and the cathode of the photoelectric conversion unit PD is connected to the source of the transfer transistor M1. The drain of the transfer transistor M1 is connected to the source of the reset transistor M2 and the gate of the amplifying transistor M3. A node to which the drain of the transfer transistor M1, the source of the reset transistor M2, and the gate of the amplifying transistor M3 are connected is a floating diffusion portion FD. The floating diffusion portion FD has a capacitance component (floating diffusion capacitance) and functions as a charge holding portion. The floating diffusion capacitance includes parasitic capacitance in an electrical path from the transfer transistor M1 to the amplifying transistor M3 via the floating diffusion portion FD.

The drain of the reset transistor M2 and the drain of the amplifying transistor M3 are connected to a power supply voltage node to which a voltage VDD is supplied. The source of the amplifying transistor M3 is connected to the drain of the selection transistor M4. The source of the selection transistor M4 is connected to the output line 40.

A current source 41 is connected to the output line 40. The current source 41 may be a current source whose current value can be switched or a constant current source whose current value is constant.

In the case of the pixel configuration of FIG. 2, the control lines 30 of each row includes a signal line connected to the gate of the transfer transistor M1, a signal line connected to the gate of the reset transistor M2, and a signal line connected to the gate of the selection transistor M4. A control signal pTX is supplied from the vertical scanning circuit 101 to the gate of the transfer transistor M1. A control signal pRES is supplied from the vertical scanning circuit 101 to the gate of the reset transistor M2. A control signal pSEL is supplied from the vertical scanning circuit 101 to the gate of the selection transistor M4. A plurality of pixels 20 in the same row are connected to a common signal line, and are controlled simultaneously by a common control signal.

In the present embodiment, each transistor constituting the pixel 20 is an N-type MOS transistor. Therefore, when a high-level control signal is supplied from the vertical scanning circuit 101, the corresponding transistor is turned on. When a low-level control signal is supplied from the vertical scanning circuit 101, the corresponding transistor is turned off. The terms "source" and "drain" of the MOS transistor may vary depending on the conductivity type of the transistor or the target function. Some or all of the names of "source" and "drain" used in this embodiment may be referred to by the opposite names.

The photoelectric conversion unit PD converts (photoelectrically converts) incident light into charges corresponding to the amount of the incident light. The transfer transistor M1 is turned on to transfer charges held in the photoelectric conversion unit PD to the floating diffusion portion FD. The charges transferred from the photoelectric conversion unit PD is held in the capacitance (floating diffusion capacitance) of the floating diffusion portion FD. As a result, the floating diffusion portion FD has a potential corresponding to the amount of charges transferred from the photoelectric conversion unit PD by charge-to-voltage conversion by the floating diffusion capacitance.

The selection transistor M4 is turned on to connect the amplifying transistor M3 to the output line 40. The amplifying transistor M3 is configured such that a voltage VDD is supplied to the drain of the amplifying transistor M3 and a bias current is supplied from the current source 41 to the source of the amplifying transistor M3 via the selection transistor M4, and constitutes an amplifying unit (source follower circuit). The gate of the amplifying transistor M3 functions as an input node of the amplifying unit. Accordingly, the amplifying transistor M3 outputs a signal based on the potential of the floating diffusion portion FD to the output line 40 through the selection transistor M4. In this sense, the amplifying transistor M3 and the selection transistor M4 are an output unit that outputs a pixel signal corresponding to the amount of charges held in the floating diffusion portion FD.

The reset transistor M2 has a function of resetting the floating diffusion portion FD by controlling supply of a voltage (voltage VDD) to the floating diffusion portion FD. When the reset transistor M2 is turned on, the floating diffusion portion FD is reset to a voltage corresponding to the voltage VDD.

Although FIG. 2 illustrates a configuration in which a signal is output to the corresponding output line 40 through one selection transistor M4, the configuration of the selection transistor M4 and the output line 40 is not limited thereto. For example, in a configuration in which a plurality of selection transistors M4 and a plurality of output lines 40 are arranged for one pixel 20, a configuration may be adopted in which the output line 40 for outputting a signal can be selected by individually controlling the plurality of selection transistors M4.

Figure 3:
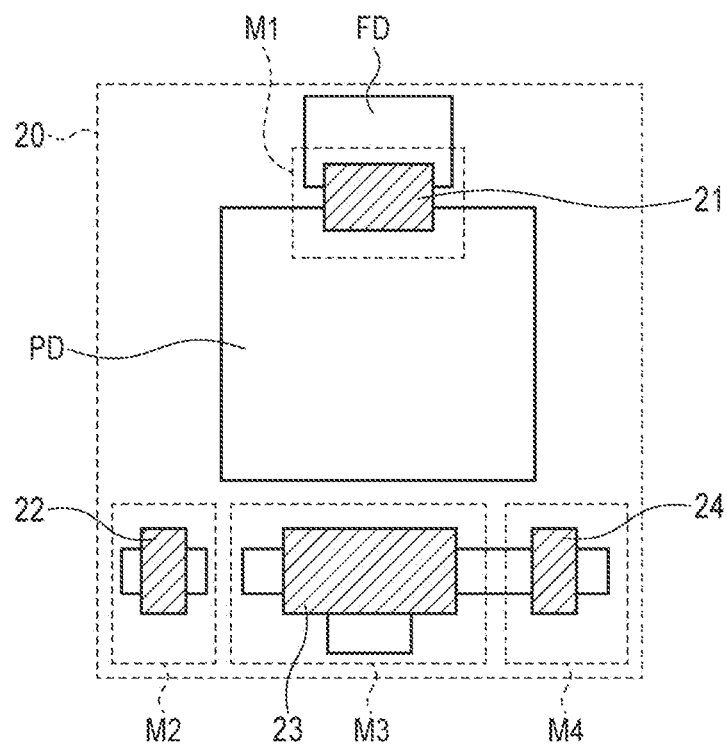
FIG. 3 is a schematic plan view of the pixel according to the first embodiment.

FIG. 3 is a schematic plan view of the pixel 20 according to the present embodiment. FIG. 3 illustrates an arrangement of the photoelectric conversion unit PD, the floating diffusion portion FD, and the gate, source, and drain of each transistor in a plan view with respect to the substrate. The gates 21, 22, 23, and 24 illustrated in FIG. 3 indicates an arrangement of the gate electrodes of the transfer transistor M1, the reset transistor M2, the amplifying transistor M3, and the selection transistor M4, respectively.

As illustrated in FIG. 3, the photoelectric conversion unit PD is arranged near the center of the pixel 20. The floating diffusion portion FD is arranged outside the photoelectric conversion unit PD, and the gate 21 is arranged between the photoelectric conversion unit PD and the floating diffusion portion FD. The gates 22, 23, and 24 are arranged side by side on the side opposite to the floating diffusion portion FD with respect to the photoelectric conversion unit PD.

In the layout of FIG. 3, the amplifying transistor M3 and the selection transistor M4 are formed in the same active region, but the layout is not limited thereto. An element isolation region is formed between the plurality of active regions.

Figure 4:
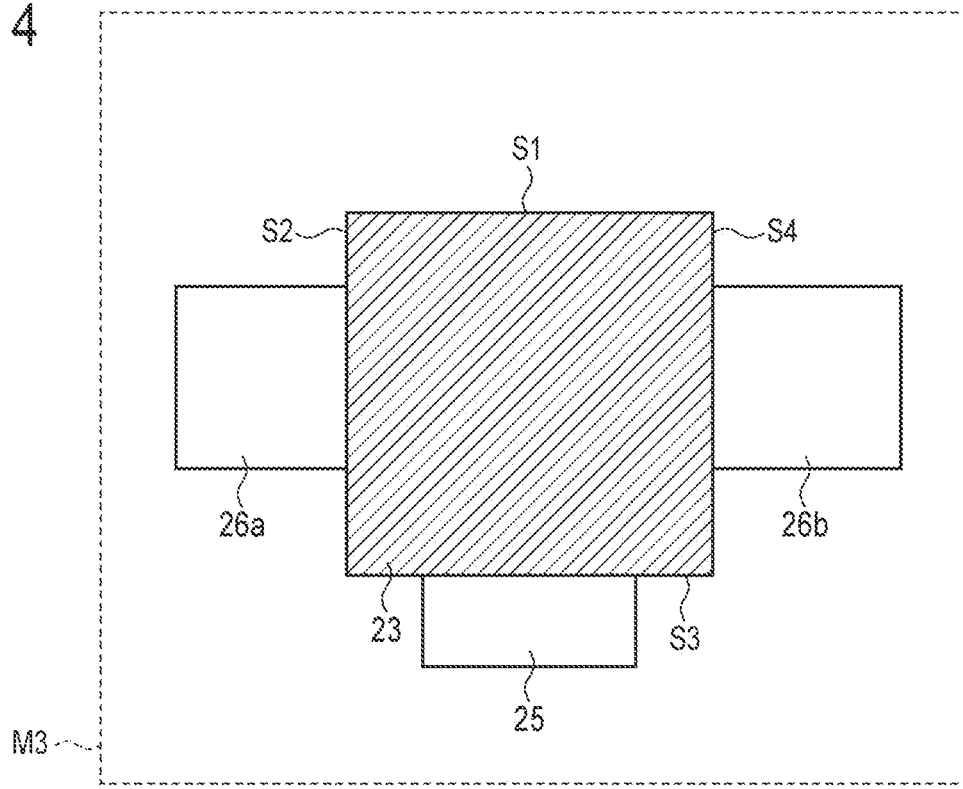
FIG. 4 is a schematic plan view of an amplifying transistor according to the first embodiment.

FIG. 4 is a schematic plan view of the amplifying transistor M3 according to the present embodiment. In other words, FIG. 4 is an enlarged view of the amplifying transistor M3 in FIG. 3. The amplifying transistor M3 has one gate 23, one drain 25, and two sources 26a and 26b. As illustrated in FIG. 4, the gate 23 has a quadrangular shape having four sides S1, S2, S3, and S4. The drain 25 is adjacent to the side S3. The source 26a is adjacent to the side S2, and the source 26b is adjacent to the side S4. Thus, the sources 26a and 26b are adjacent to the two sides S2 and S4 opposed to each other, and the drain 25 is adjacent to the side S3 that is not opposed to the sides S2 and S4. As described above, in the present embodiment, the amplifying transistor M3 has nodes of the two sources 26a and 26b for one gate 23. The nodes of the two sources 26a and 26b may be electrically connected via, for example, a contact plug and a metal wiring. However, the nodes of the two sources 26a, 26b may be electrically independent.

As described above, in the amplifying transistor M3 of the present embodiment, the gate 23 has the four sides S1, S2, S3, and S4 in the plan view. A plurality of main electrodes including the two sources 26a and 26b (a plurality of first main electrodes) and the drain 25 (a second main electrode) are adjacent to the three sides S2, S3, and S4 of the gate 23. The effect of the amplifying transistor M3 having such a configuration will be described below.

In order to realize high frame rate photographing, it is required to speed up the operation of the amplifying transistor M3. One of the methods for achieving high speed is to increase the transconductance gm of the amplifying transistor M3. The transconductance gm of the amplifying transistor M3 is increased by shortening the gate length L or widening the gate width W.

In general, the random noise of the amplifying transistor M3 is inversely proportional to the product of the gate length L and the gate width W of the amplifying transistor M3. Therefore, when the gate length L of the amplifying transistor M3 is shortened, the random noise of the amplifying transistor M3 increases.

On the other hand, when the gate width W of the amplifying transistor M3 is widened, the area of the region of the photoelectric conversion unit PD arranged in the vicinity of the amplifying transistor M3 may need to be reduced in order to secure the area of the gate 23, thereby reducing the saturation signal amount of the pixel 20.

Thus, when the gate length L of the amplifying transistor M3 is shortened or the gate width W is widened in order to increase the transconductance gm, the quality of the output signal may deteriorate.

On the other hand, in the present embodiment, the two sources 26a and 26b of the amplifying transistor M3 are adjacent to the two sides S2 and S4 of the gate 23. Thus, by arranging the sources 26a and 26b on two or more sides of the gate 23, a state equivalent to a state in which the gate width W of the amplifying transistor M3 is widened is realized. This increases transconductance gm. However, from the viewpoint of the actual dimension of the gate 23 of the amplifying transistor M3, since neither the shortening of the gate length L nor the widening of the gate width W is performed, the degradation of the signal quality as described above is less likely to occur. As described above, since a state in which the actual dimension is not changed while effectively widening the gate width W of the amplifying transistor M3 is realized, it is possible to achieve both the signal quality and the transconductance gm. Therefore, according to the present embodiment, it is possible to provide a photoelectric conversion device with improved performance.

As one method for increasing the S/N ratio of the photoelectric conversion device, there is a method in which the parasitic capacitance of the floating diffusion portion FD is reduced to improve photoelectric conversion efficiency, and random noise superimposed on an output signal is reduced. Therefore, the parasitic capacitance of the floating diffusion portion FD is desirably reduced from the viewpoint of improving the S/N ratio by reducing random noise.

As another method of increasing the transconductance gm of the amplifying transistor, a method of widening the gate width W of the amplifying transistor or a method of connecting a plurality of amplifying transistors in parallel may be considered. When these methods are adopted, parasitic capacitance generated between the floating diffusion portion FD and the gate 23 of the amplifying transistor M3 may be large. When the capacitance of the floating diffusion portion FD increases due to the parasitic capacitance, the photoelectric conversion efficiency decreases, and the random noise superimposed on the output signal may increase.

On the other hand, in the photoelectric conversion device of the present embodiment, the drain 25 is adjacent to only one side of the gate 23, and a state equivalent to a state in which the gate width W of the drain 25 of the amplifying transistor M3 is effectively narrowed is realized. Thus, parasitic capacitance between the power supply voltage node to which the voltage VDD (power supply potential) is supplied and the gate 23 of the amplifying transistor M3 can be reduced. Therefore, since the capacitance of the floating diffusion portion FD is reduced and the photoelectric conversion efficiency is improved, the effect of reducing the random noise superimposed on the output signal is obtained.

The layout of the amplifying transistor M3 is not limited to that illustrated in FIGS. 3 and 4. Hereinafter, a modified example of the layout of the amplifying transistor M3 will be described with reference to FIGS. 5 to 10.

Figure 5:
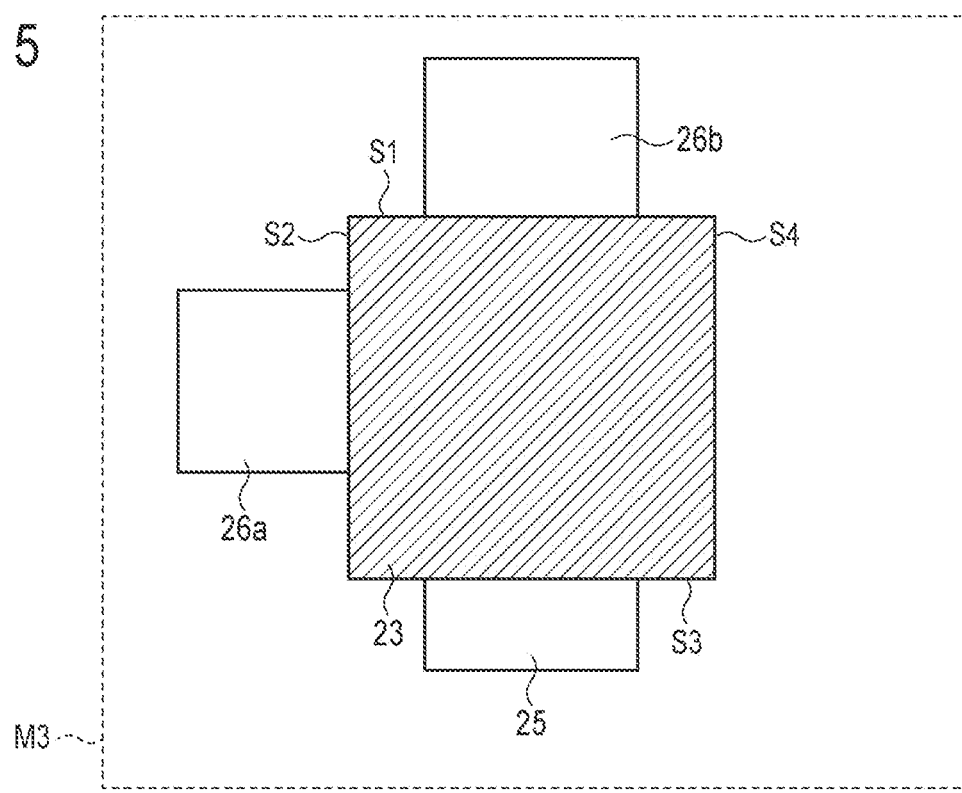
FIG. 5 is a schematic plan view of an amplifying transistor according to a modified example of the first embodiment.

FIG. 5 is a schematic plan view of an amplifying transistor M3 according to a modification of the present embodiment. The amplifying transistor M3 has one gate 23, one drain 25, and two sources 26a and 26b. As illustrated in FIG. 5, the gate 23 has a quadrangular shape having four sides S1, S2, S3, and S4. The drain 25 is adjacent to the side S3. The source 26a is adjacent to the side S2, and the source 26b is adjacent to the side S1. Thus, the sources 26a and 26b are adjacent to the two sides S2 and S1 that are not opposed to each other, and the drain 25 is adjacent to the side S3 that is opposed to the side S1. As described above, also in this modification, the amplifying transistor M3 has nodes of the two sources 26a and 26b for one gate 23. The nodes of the two sources 26a and 26b may be electrically connected via, for example, a contact plug and a metal wiring. However, the nodes of the two sources 26a, 26b may be electrically independent. Also in this modification, the same effect as the configuration illustrated in FIG. 4 can be obtained. Thus, the positions of the sides of the gate 23 adjacent to the two sources 26a and 26b are not limited to that illustrated in FIG. 4.

Figure 6:
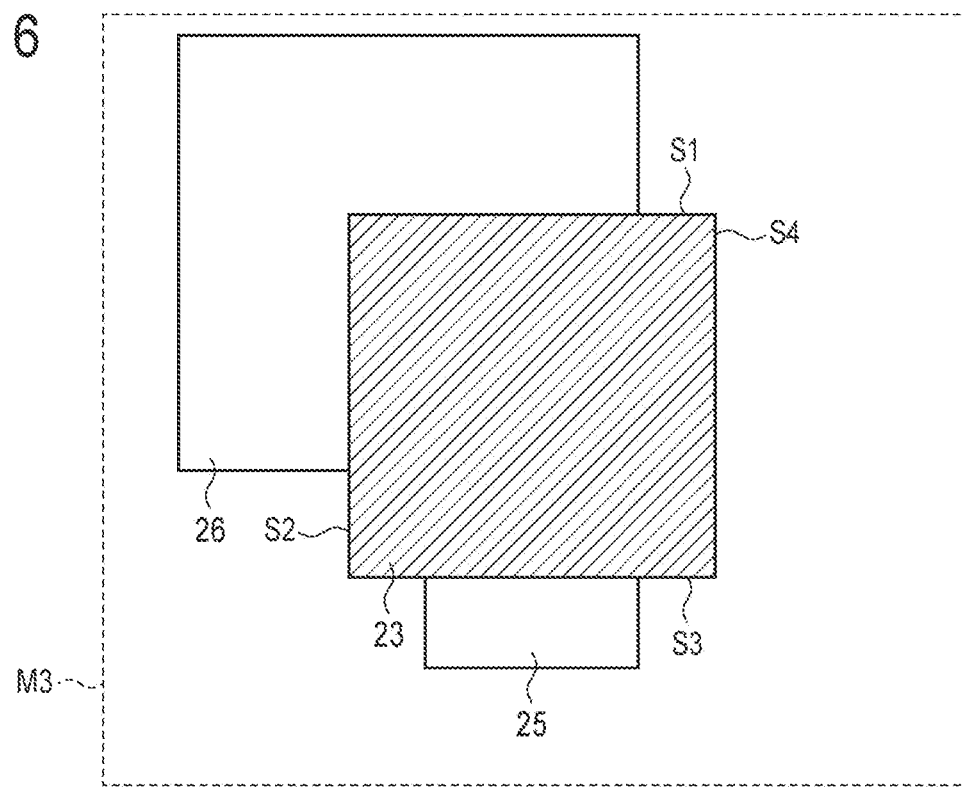
FIG. 6 is a schematic plan view of an amplifying transistor according to another modified example of the first embodiment.

FIG. 6 is a schematic plan view of an amplifying transistor M3 according to another modification of the present embodiment. The amplifying transistor M3 has one gate 23, one drain 25, and one source 26. As illustrated in FIG. 6, the gate 23 has a quadrangular shape having four sides S1, S2, S3, and S4. The drain 25 is adjacent to the side S3. The source 26 is adjacent to the side S1 and the side S2. Thus, the source 26 is adjacent to the two sides S1 and S2 that are not opposed to each other, and the drain 25 is adjacent to the side S3 that is opposed to the side S1 and not opposed to the side S2. As described above, in this modification, the amplifying transistor M3 has a node of the source 26 adjacent to one gate 23 on two sides. Also in this modification, the same effect as the configuration illustrated in FIG. 4 can be obtained. As described above, in the amplifying transistor M3 of the present embodiment, one source 26 may be adjacent to two or more sides of the gate 23.

Figure 7:
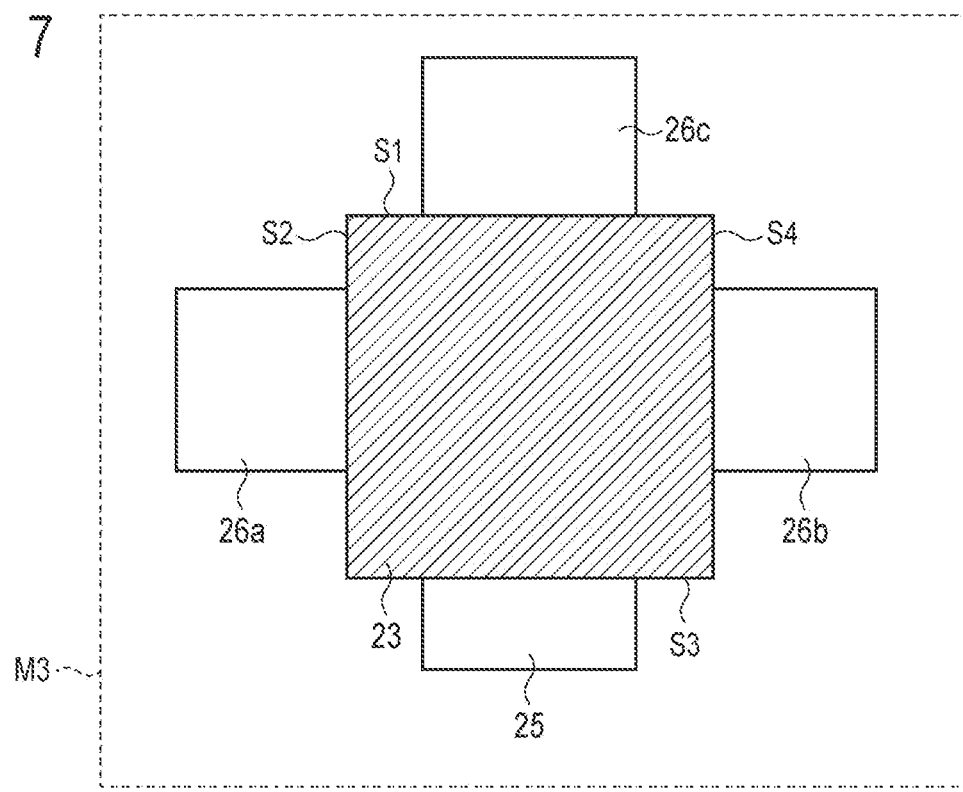
FIG. 7 is a schematic plan view of an amplifying transistor according to another modified example of the first embodiment.

FIG. 7 is a schematic plan view of an amplifying transistor M3 according to another modification of the present embodiment. The amplifying transistor M3 has one gate 23, one drain 25, and three sources 26a, 26b, and 26c. As illustrated in FIG. 7, the gate 23 has a quadrangular shape having four sides S1, S2, S3, and S4. The drain 25 is adjacent to the side S3. The source 26a is adjacent to the side S2, the source 26b is adjacent to the side S4, and the source 26c is adjacent to the side S1. Thus, the sources 26a and 26b are adjacent to the two sides S2 and S4 opposed to each other, and the source 26c is adjacent to the side S1 not opposed to those sides. The drain 25 is adjacent to the side S3 opposed to the side S1. As described above, in this modification, the amplifying transistor M3 has three nodes of the sources 26a, 26b, and 26c for one gate 23. The nodes of the three sources 26a, 26b, and 26c may be electrically connected via, for example, a contact plug and a metal wiring. However, the nodes of the two sources 26a, 26b may be electrically independent. Also in this modification, the same effect as the configuration illustrated in FIG. 4 can be obtained. Thus, the number of sides of the gate 23 adjacent to the source is not limited to two as illustrated in FIG. 4, and may be three or more.

Figure 8:
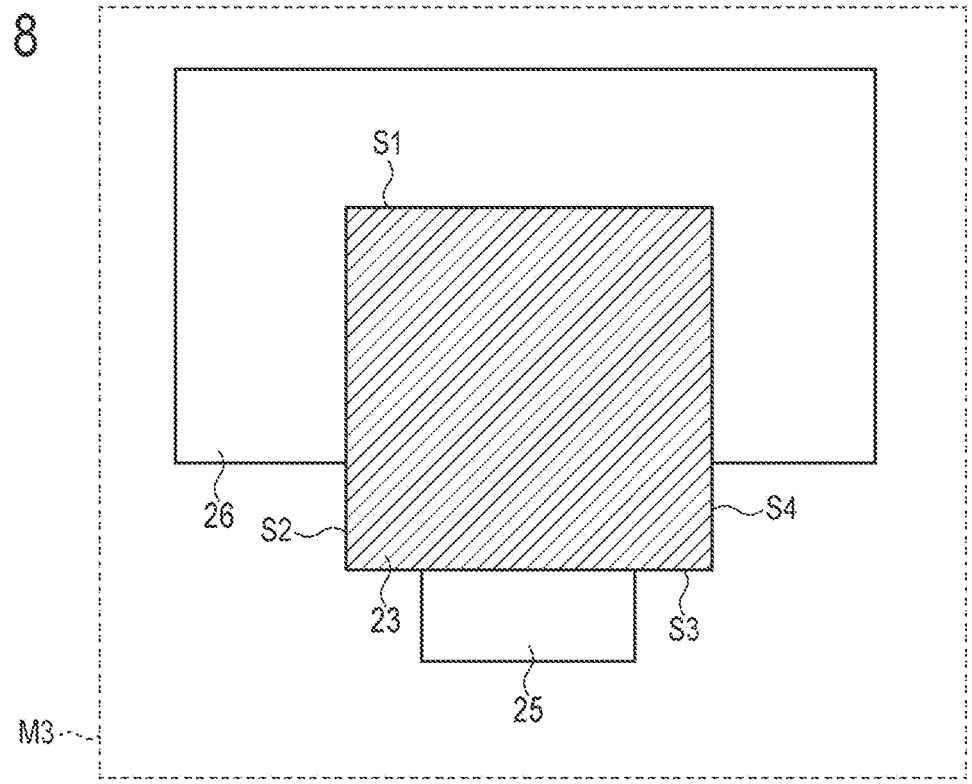
FIG. 8 is a schematic plan view of an amplifying transistor according to another modified example of the first embodiment.

FIG. 8 is a schematic plan view of an amplifying transistor M3 according to another modification of the present embodiment. The amplifying transistor M3 has one gate 23, one drain 25, and one source 26. As illustrated in FIG. 8, the gate 23 has a quadrangular shape having four sides S1, S2, S3, and S4. The drain 25 is adjacent to the side S3. The source 26 is adjacent to the side S1, the side S2, and the side S4. Thus, the source 26 is adjacent to the three sides S1, S2, and S4, and the drain 25 is adjacent to the side S3 that is opposed to the side S1 and not opposed to the sides S2 and S4. As described above, in this modification, the amplifying transistor M3 has nodes of the source 26 adjacent to three sides of one gate 23. Also in this modification, the same effect as the configuration illustrated in FIG. 4 can be obtained. As described above, in the amplifying transistor M3 of the present embodiment, one source 26 may be adjacent to three or more sides of the gate 23.

Figure 9:
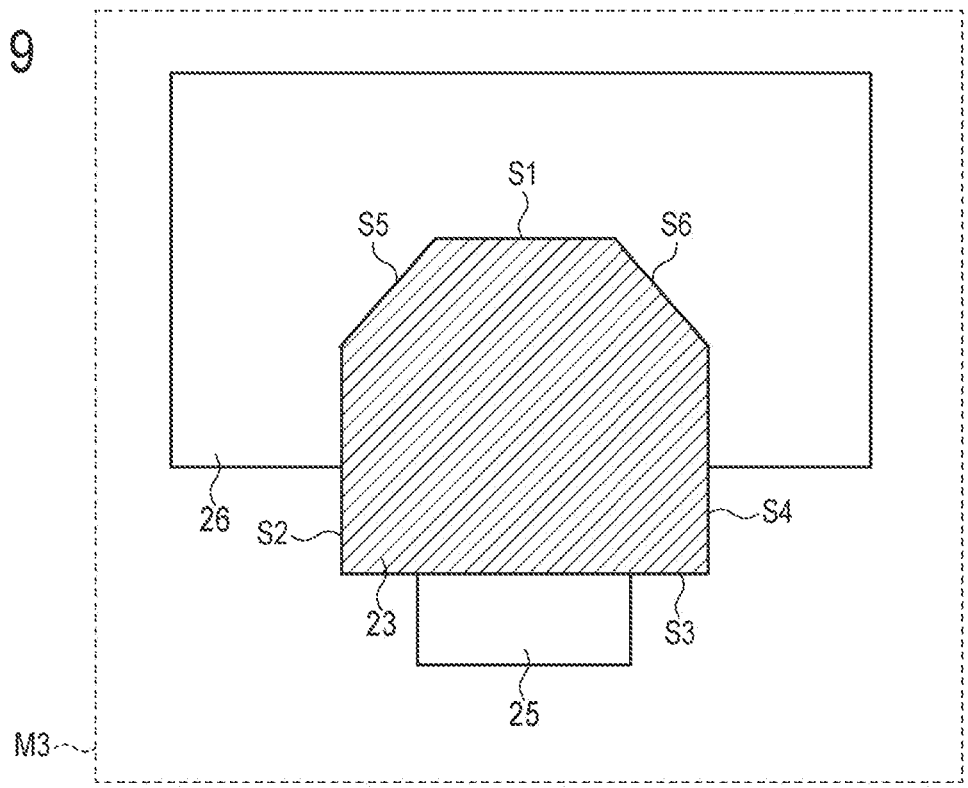
FIG. 9 is a schematic plan view of an amplifying transistor according to another modified example of the first embodiment.

FIG. 9 is a schematic plan view of an amplifying transistor M3 according to another modification of the present embodiment. The amplifying transistor M3 has one gate 23, one drain 25, and one source 26. As illustrated in FIG. 9, the gate 23 is a hexagon having six sides S1, S2, S3, S4, S5, and S6. The drain 25 is adjacent to the side S3. The source 26 is adjacent to the sides S1, S2, S4, S5, and S6. Thus, the source 26 is adjacent to the five sides S1, S2, S4, S5, and S6, and the drain 25 is adjacent to the side S3 that is opposed to the side S1 and not opposed to the sides S2, S4, S5, and S6. As described above, in this modification, the amplifying transistor M3 has a node of the source 26 adjacent to one gate 23 on five sides. Also in this modification, the same effect as the configuration illustrated in FIG. 4 can be obtained. As described above, the amplifying transistor M3 of the present embodiment may have a polygonal shape having more than four sides, and one source 26 may be adjacent to more than four sides of the gate 23.

Figure 10:
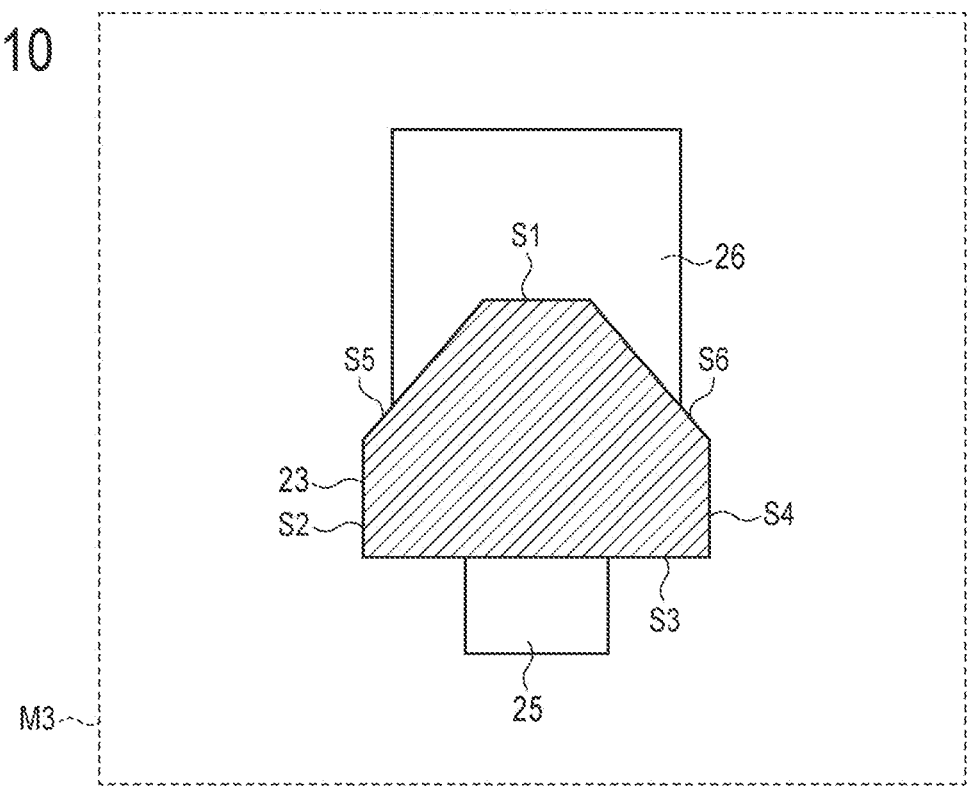
FIG. 10 is a schematic plan view of an amplifying transistor according to another modified example of the first embodiment.

FIG. 10 is a schematic plan view of an amplifying transistor M3 according to another modification of the present embodiment. The amplifying transistor M3 has one gate 23, one drain 25, and one source 26. As illustrated in FIG. 10, the gate 23 is a hexagon having six sides S1, S2, S3, S4, S5, and S6. The drain 25 is adjacent to the side S3. The source 26 is adjacent to the side S1, the side S5, and the side S6. Thus, the source 26 is adjacent to the three sides S1, S5, and S6, and the drain 25 is adjacent to the side S3 that is opposed to the side S1 and not opposed to the sides S2 and S4. As described above, in this modification, the amplifying transistor M3 has nodes of the source 26 adjacent to three sides of one gate 23. Also in this modification, the same effect as the configuration illustrated in FIG. 4 can be obtained. As described above, the amplifying transistor M3 of the present embodiment may have a polygonal shape having more than four sides, and one source 26 may be adjacent to less than four sides of the gate 23.

Second Embodiment

The photoelectric conversion device according to the present embodiment will be described. Components similar to those in the first embodiment are denoted by the same reference numerals, and descriptions of these components may be omitted or simplified.

Figure 11:
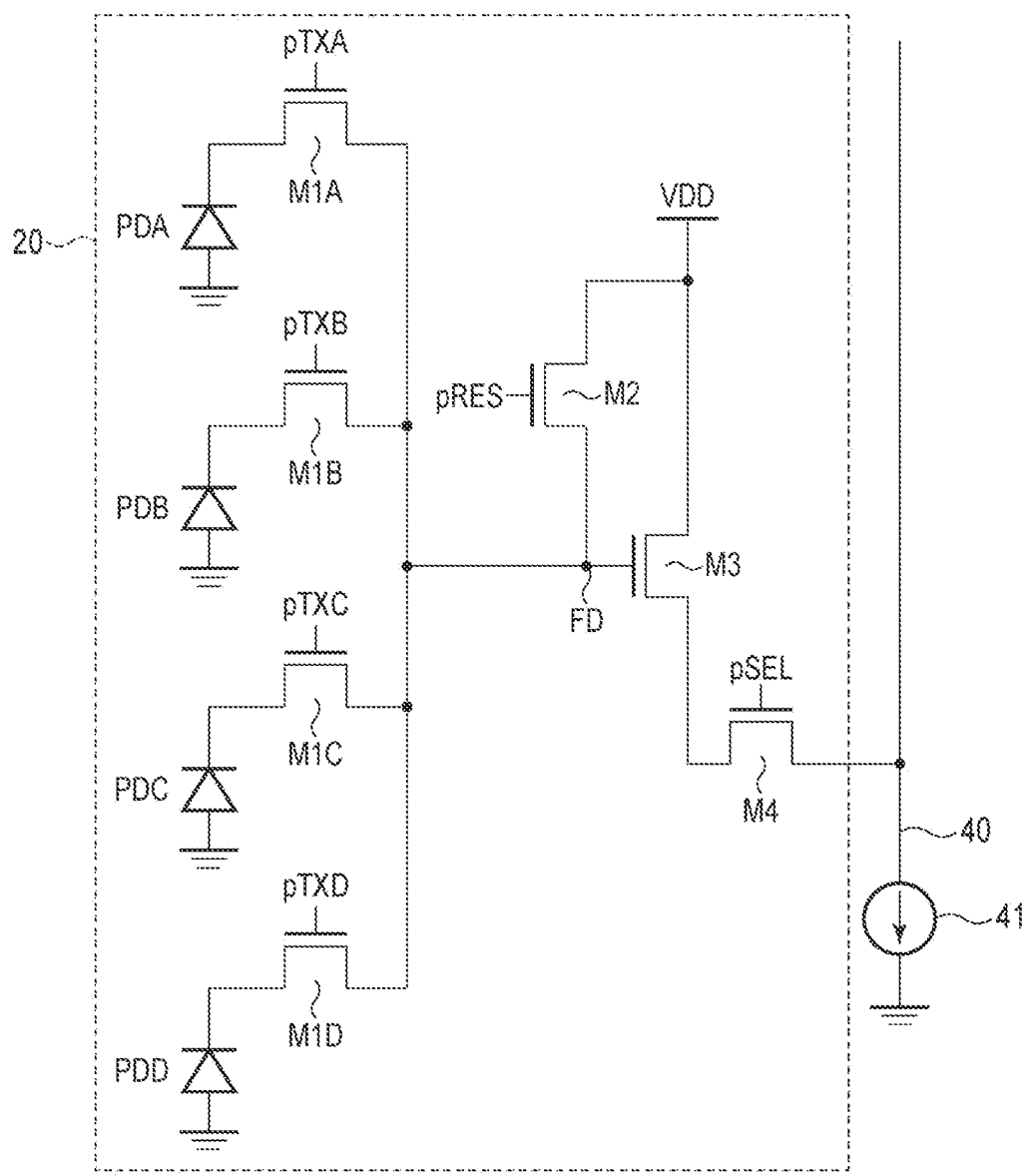
FIG. 11 is an equivalent circuit diagram of a pixel according to a second embodiment.

FIG. 11 is an equivalent circuit diagram of the pixel 20 according to the present embodiment. As illustrated in FIG. 11, the pixel 20 includes photoelectric conversion units PDA, PDB, PDC, and PDD, transfer transistors M1A, M1B, M1C, and M1D, a reset transistor M2, an amplifying transistor M3, and a selection transistor M4. The anodes of the photoelectric conversion units PDA, PDB, PDC, and PDD are connected to a ground node. The cathodes of the photoelectric conversion units PDA, PDB, PDC, and PDD are connected to the sources of the transfer transistors M1A, M1B, M1C, and M1D, respectively. The drains of the transfer transistors M1A, M1B, M1C, and M1D are connected to the floating diffusion portion FD. Control signals pTXA, pTXB, pTXC, and pTXD are supplied from the vertical scanning circuit 101 to gates of the transfer transistors M1A, M1B, M1C, and M1D, respectively.

In the present embodiment, charges can be transferred from the four transfer transistors M1A, M1B, M1C, and M1D to one floating diffusion FD. Thus, the reset transistor M2, the amplifying transistor M3, and the selection transistor M4 are shared by the four photoelectric conversion units PDA, PDB, PDC, and PDD.

Figure 12:
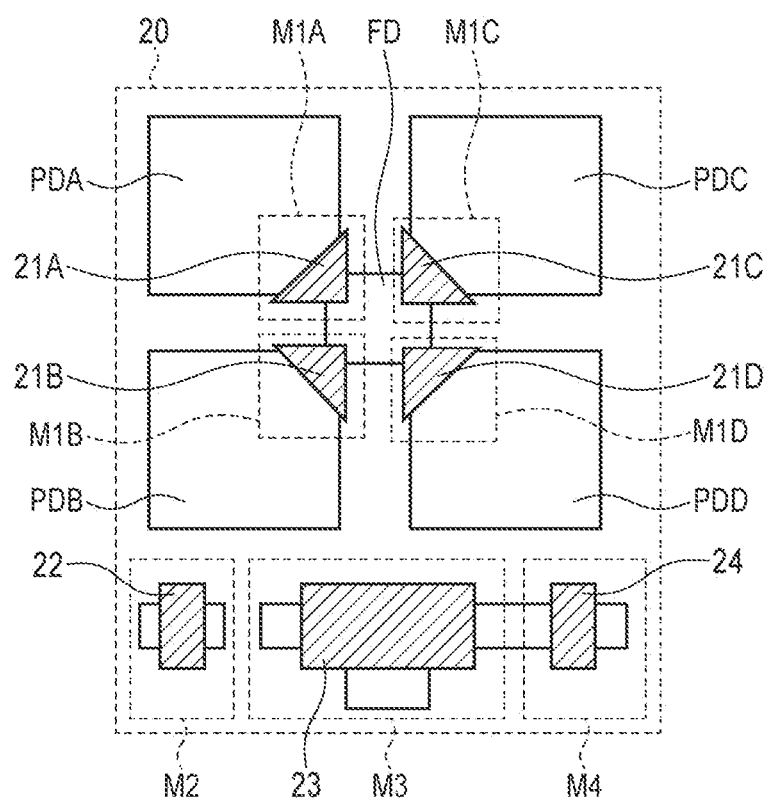
FIG. 12 is a schematic plan view of the pixel according to the second embodiment.

FIG. 12 is a schematic plan view of the pixel 20 according to the present embodiment. FIG. 12 illustrates an arrangement of the photoelectric conversion units PDA, PDB, PDC, and PDD, the floating diffusion portion FD, and the gate, source, and drain of each transistor in a plan view with respect to the substrate. The gate 21A, 21B, 21C, and 21D illustrated in FIG. 12 indicate an arrangement of the gate electrodes of the transfer transistors M1A, M1B, M1C, and M1D, respectively. The gates 22, 23, and 24 illustrated in FIG. 12 indicate an arrangement of the gate electrodes of the reset transistor M2, the amplifying transistor M3, and the selection transistor M4, respectively.

As illustrated in FIG. 12, the four photoelectric conversion units PDA, PDB, PDC, and PDD are arranged in two rows and two columns. The floating diffusion portion FD is arranged near the center of the four photoelectric conversion units PDA, PDB, PDC, and PDD. The gates 21A, 21B, 21C, and 21D are arranged between the photoelectric conversion units PDA, PDB, PDC, and PDD and the floating diffusion portion FD, respectively. The arrangement of the reset transistor M2, the amplifying transistor M3, and the selection transistor M4 is the same as in FIG. 3.

Any of the configurations of FIGS. 4 to 10 can be applied to the arrangement of the gate, source, and drain of the amplifying transistor M3. That is, as in the first embodiment, the amplifying transistor M3 is configured such that the source thereof is adjacent to a plurality of sides of the gate 23. Therefore, also in the present embodiment, it is possible to provide a photoelectric conversion device with improved performance as in the first embodiment.

In the present embodiment, the four photoelectric conversion units arranged to form two rows and two columns share one floating diffusion portion FD, but it is not limited thereto. The number, arrangement, and the like of the photoelectric conversion units can be appropriately changed.

In the configuration illustrated in FIGS. 11 and 12, a plurality of photoelectric conversion units sharing one floating diffusion portion FD may be arranged to correspond to one microlens. In this configuration, light transmitted through one microlens is incident on the plurality of photoelectric conversion units. By using signals accumulated in the plurality of photoelectric conversion units, focus detection of a phase difference detection method can be performed. The signal processing for focus detection can be performed by a signal processing unit or the like in a photoelectric conversion system including the photoelectric conversion device.

Third Embodiment

Figure 13:
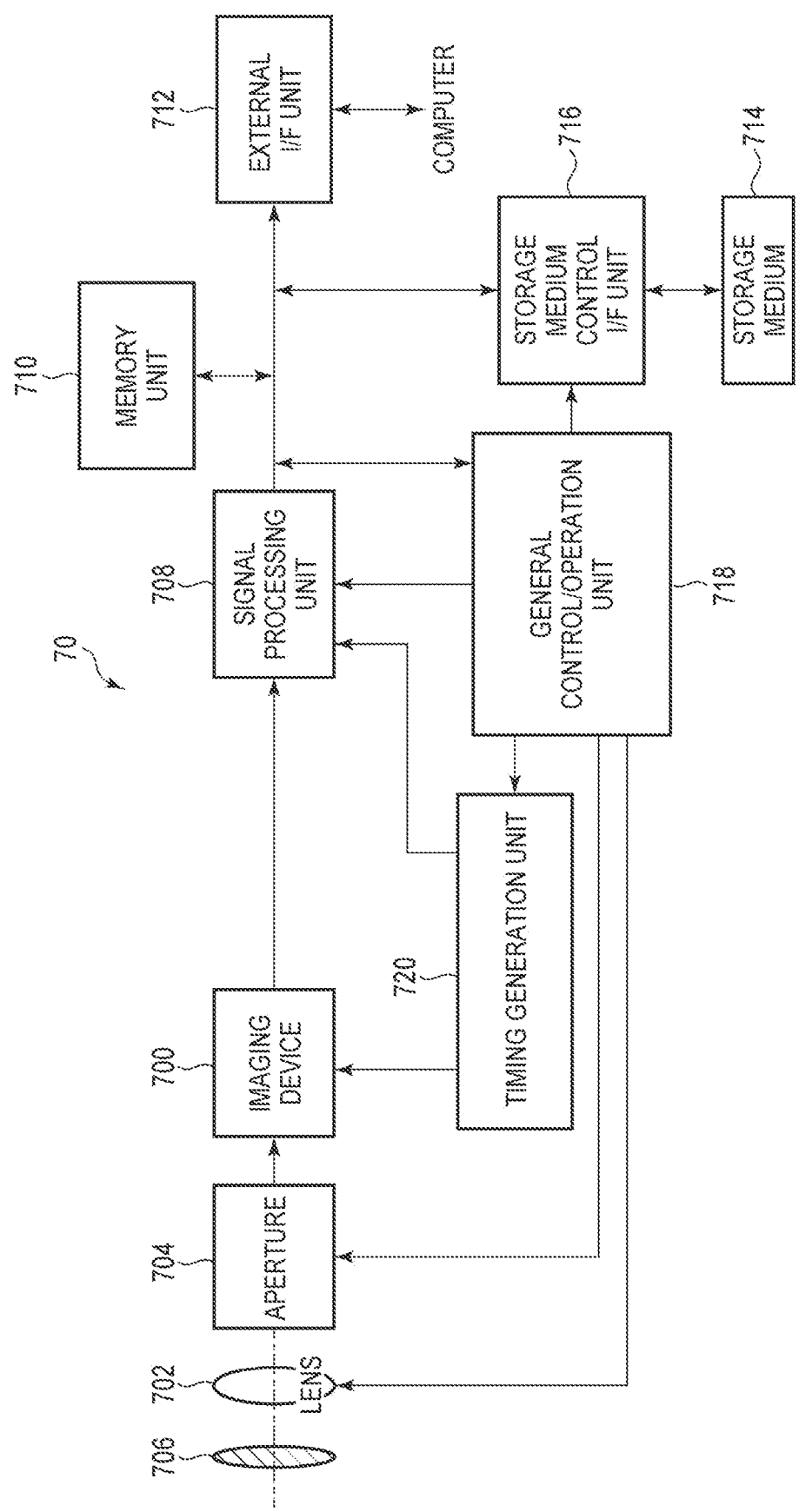
FIG. 13 is a block diagram of equipment according to a third embodiment.

The photoelectric conversion device of the above embodiments can be applied to various equipment. Examples of the equipment include a digital still camera, a digital camcorder, a camera head, a copying machine, a facsimile, a mobile phone, a vehicle-mounted camera, an observation satellite, and a surveillance camera. FIG. 13 is a block diagram of a digital still camera as an example of equipment.

The equipment 70 illustrated in FIG. 13 includes a barrier 706, a lens 702, an aperture 704, and an imaging device 700 (an example of a photoelectric conversion device). The equipment 70 further includes a signal processing unit (processing device) 708, a timing generation unit 720, a general control/operation unit 718 (control device), a memory unit 710 (storage device), a storage medium control I/F unit 716, a storage medium 714, and an external I/F unit 712. At least one of the barrier 706, the lens 702, and the aperture 704 is an optical device corresponding to the equipment. The barrier 706 protects the lens 702, and the lens 702 forms an optical image of an object on the imaging device 700. The aperture 704 varies the amount of light passing through the lens 702. The imaging device 700 is configured as in the above embodiments, and converts an optical image formed by the lens 702 into image data (image signal). The signal processing unit 708 performs various corrections, data compression, and the like on the captured image data output from the imaging device 700. The timing generation unit 720 outputs various timing signals to the imaging device 700 and the signal processing unit 708. The general control/operation unit 718 controls the entire digital still camera, and the memory unit 710 temporarily stores image data. The storage medium control I/F unit 716 is an interface for storing or reading image data on the storage medium 714, and the storage medium 714 is a detachable storage medium such as a semiconductor memory for storing or reading captured image data. An external I/F unit 712 is an interface for communicating with an external computer or the like. The timing signal or the like may be input from the outside of the equipment. The equipment 70 may further include a display device (a monitor, an electronic view finder, or the like) for displaying information obtained by the photoelectric conversion device. The equipment includes at least a photoelectric conversion device. Further, the equipment 70 includes at least one of an optical device, a control device, a processing device, a display device, a storage device, and a mechanical device that operates based on information obtained by the photoelectric conversion device. The mechanical device is a movable portion (for example, a robot arm) that receives a signal from the photoelectric conversion device and operates.

Each pixel may include a plurality of photoelectric conversion units (a first photoelectric conversion unit and a second photoelectric conversion unit). The signal processing unit 708 may be configured to process a pixel signal based on the charges generated in the first photoelectric conversion unit and a pixel signal based on the charges generated in the second photoelectric conversion unit, and acquire distance information from the imaging device 700 to the object.

Fourth Embodiment

Figure 14A:
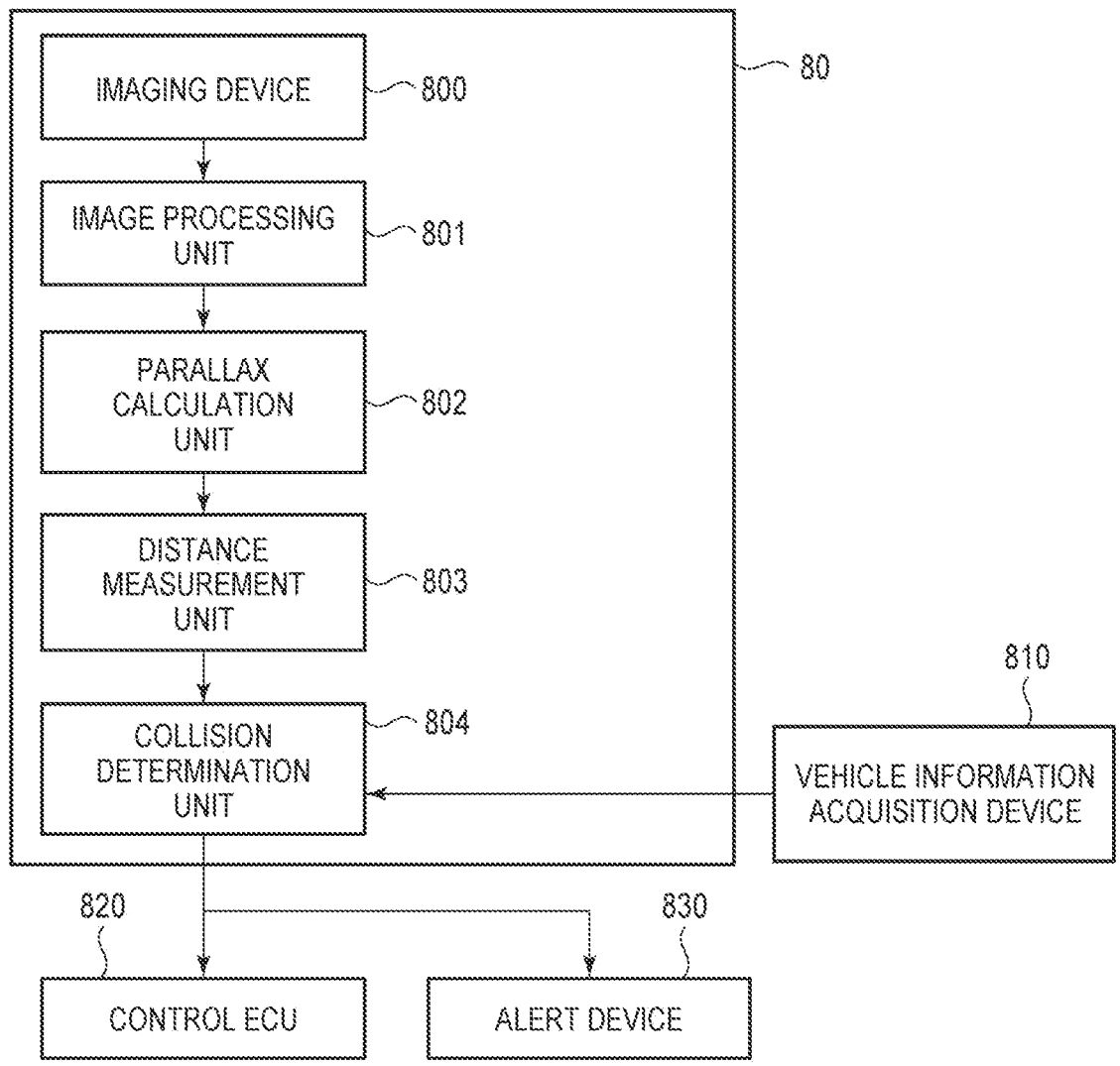
FIGS. 14A and 14B are block diagrams of equipment according to a fourth embodiment.
Figure 14B:
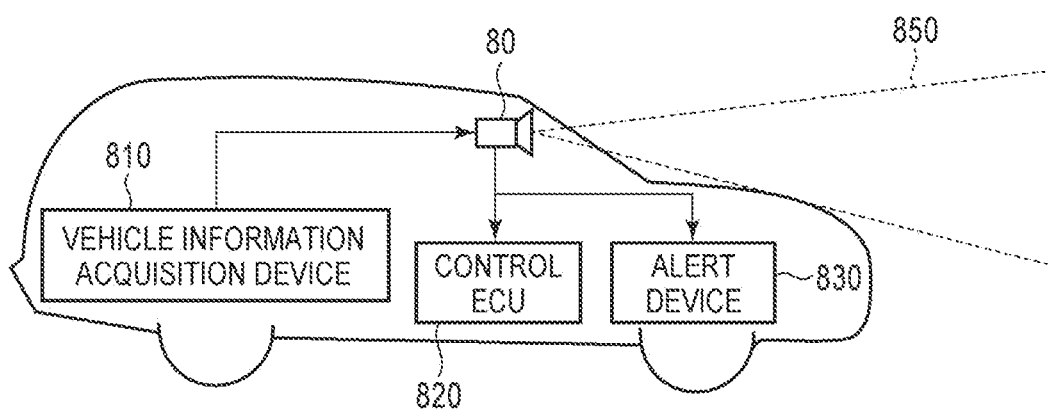

FIGS. 14A and 14B are block diagrams of equipment relating to the vehicle-mounted camera according to the present embodiment. The equipment 80 includes the imaging device 800 (an example of a photoelectric conversion device) of the above-described embodiments and a signal processing device (processing device) that processes a signal from the imaging device 800. The equipment 80 includes an image processing unit 801 that performs image processing on a plurality of pieces of image data acquired by the imaging device 800, and a parallax calculation unit 802 that calculates parallax (phase difference of parallax images) from the plurality of pieces of image data acquired by the equipment 80. The equipment 80 includes a distance measurement unit 803 that calculates a distance to an object based on the calculated parallax, and a collision determination unit 804 that determines whether or not there is a possibility of collision based on the calculated distance. Here, the parallax calculation unit 802 and the distance measurement unit 803 are examples of a distance information acquisition unit that acquires distance information to the object. That is, the distance information is information on a parallax, a defocus amount, a distance to the object, and the like. The collision determination unit 804 may determine the possibility of collision using any of these pieces of distance information. The distance information acquisition unit may be realized by dedicatedly designed hardware or a software module. Further, it may be realized by a field programmable gate array (FPGA), an application specific integrated circuit (ASIC), or a combination thereof.

The equipment 80 is connected to a vehicle information acquisition device 810, and can obtain vehicle information such as a vehicle speed, a yaw rate, and a steering angle. Further, the equipment 80 is connected to a control ECU 820 which is a control device that outputs a control signal for generating a braking force to the vehicle based on a determination result of the collision determination unit 804. The equipment 80 is also connected to an alert device 830 that issues an alert to the driver based on the determination result of the collision determination unit 804. For example, when the collision possibility is high as the determination result of the collision determination unit 804, the control ECU 820 performs vehicle control to avoid collision or reduce damage by braking, returning an accelerator, suppressing engine output, or the like. The alert device 830 alerts the user by sounding an alarm such as a sound, displaying alert information on a screen of a car navigation system or the like, or providing vibration to a seat belt or a steering wheel. The equipment 80 functions as a control unit for controlling the operation of controlling the vehicle as described above.

In the present embodiment, an image of the periphery of the vehicle, for example, the front or the rear of the vehicle is captured by the equipment 80. FIG. 14B illustrates equipment in a case where an image is captured in front of the vehicle (image capturing range 850). The vehicle information acquisition device 810 as the image capturing control unit sends an instruction to the equipment 80 or the imaging device 800 to perform an image capturing operation. With such a configuration, the accuracy of distance measurement can be further improved.

Although the example of control for avoiding a collision to another vehicle has been described above, the embodiment is applicable to automatic driving control for following another vehicle, automatic driving control for not going out of a traffic lane, or the like. Furthermore, the equipment is not limited to a vehicle such as an automobile and can be applied to a movable body (movable apparatus) such as a ship, an airplane, a satellite, an industrial robot and a consumer use robot, or the like, for example. In addition, the equipment can be widely applied to equipment which utilizes object recognition or biometric authentication, such as an intelligent transportation system (ITS), a surveillance system, or the like without being limited to movable bodies.

Fifth Embodiment

The structure of the amplifying transistor M3 described in the first embodiment and the second embodiment can be applied to devices other than the imaging device. In this embodiment, an example in which a transistor having a structure similar to that of the amplifying transistor M3 is applied to a light emitting device will be described. Components similar to those in the first embodiment are denoted by the same reference numerals, and descriptions of these components may be omitted or simplified.

The light emitting device of the present embodiment can be used for an image display device, a display unit of an electronic device, a lighting device, and the like. Examples of the display device include a television receiver and a PC monitor. Examples of the electronic device include a smartphone, a mobile phone, and a camera. When the electronic device is a camera, the light emitting device of the present embodiment may be applied to a display unit such as an electronic view finder of the camera.

Figure 15:
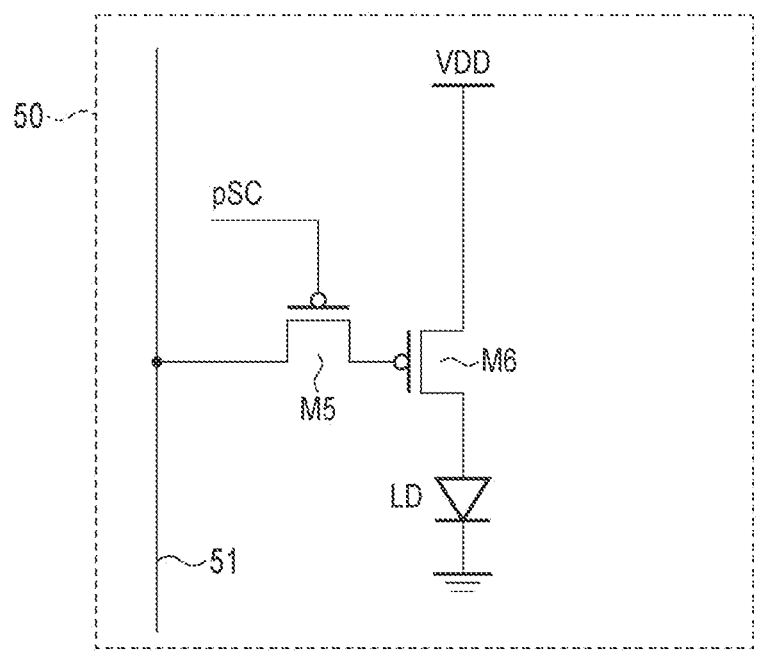
FIG. 15 is an equivalent circuit diagram of a pixel of the light emitting device according to a fifth embodiment.

FIG. 15 is an equivalent circuit diagram of the pixel 50 of the light emitting device according to the present embodiment. The pixel 50 of the present embodiment is one unit of a light emitting unit in the light emitting device. In the display device, the number of pixels 50 may be one, or the pixels 50 may be arranged in one column or arranged in a plurality of rows and a plurality of columns.

The pixel 50 includes a selection transistor M5, a driving transistor M6, and a light emitting element LD. Each transistor is assumed to be a P-type MOS transistor, but may be an N-type MOS transistor.

The light emitting element LD is, for example, a light emitting diode such as an organic light emitting diode. The cathode of the light emitting element LD is connected to a ground node, and the anode of the light emitting element LD is connected to the drain of the driving transistor M6. The source of the driving transistor M6 is connected to a power supply voltage node to which the voltage VDD is supplied. The gate of the driving transistor M6 is connected to the drain of the selection transistor M5. The source of the selection transistor M5 is connected to a signal line 51. The signal line 51 is connected to a signal output circuit (not illustrated).

The signal output circuit supplies a voltage corresponding to a luminance of the light emitting element LD to the signal line 51. A control signal pSC is input from a scanning circuit (not illustrated) to the gate of the selection transistor M5. When the selection transistor M5 is turned on in response to the control signal pSC, a voltage corresponding to the voltage of the signal line 51 is applied to the gate of the driving transistor M6. Thus, a current flows through the driving transistor M6, and the voltage is charged in the capacitance between the anode and the cathode of the light emitting element LD, whereby the light emitting element LD emits light at a luminance corresponding to the voltage of the signal line 51.

Here, any of the configurations of FIGS. 4 to 10 can be applied to the arrangement of the gate, source, and drain of the driving transistor M6. That is, similar to the amplifying transistor M3 of the first embodiment, the driving transistor M6 is configured such that a plurality of sources is adjacent to a plurality of sides of the gate 23. Thus, the transconductance gm can be increased, and a light emitting device with improved performance can be provided.

Since a state equivalent to a state in which the gate width W of the drain of the driving transistor M6 is narrowed is realized, the drain current when the driving transistor M6 is in an off state can be reduced, and an effect of improving a contrast ratio of an on state to an off state of the light emitting device can be obtained.

Modified Embodiments

The present invention is not limited to the above embodiments, and various modifications are possible. For example, an example in which some of the configurations of any of the embodiments are added to other embodiments or an example in which some of the configurations of any of the embodiments are replaced with some of the configurations of other embodiments is also an embodiment of the present invention.

The disclosure of this specification includes a complementary set of the concepts described in this specification. That is, for example, if a description of "A is B" (A=B) is provided in this specification, this specification is intended to disclose or suggest that "A is not B" even if a description of "A is not B" (A≠B) is omitted. This is because it is assumed that "A is not B" is considered when "A is B" is described.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-184890, filed Nov. 12, 2021, which is hereby incorporated by reference herein in its entirety.

What is claimed is:

1. A photoelectric conversion device comprising:
    a substrate;
    a photoelectric conversion unit configured to generate charges corresponding to incident light;
    a floating diffusion portion to which the charges generated by the photoelectric conversion unit are transferred; and
    a transistor arranged in the substrate, the transistor having a plurality of main electrodes and a gate connected to the floating diffusion portion, the transistor being configured to output a signal corresponding to a potential of the floating diffusion portion from at least one of the plurality of main electrodes,
    wherein in a plan view with respect to the substrate, the gate has four or more sides,
    wherein in the plan view, the plurality of main electrodes is adjacent to three or more sides of the gate,
    wherein the plurality of main electrodes includes a plurality of first main electrodes from which the signal corresponding to the potential of the floating diffusion portion is output,
    wherein each of the plurality of first main electrodes is adjacent to a different side among the three or more sides of the gate,
    wherein the plurality of main electrodes includes a second main electrode to which a predetermined potential is applied, and
    wherein the second main electrode is adjacent to only one of the three or more sides of the gate.

2. The photoelectric conversion device according to claim 1, wherein each of the plurality of first main electrodes has a contact plug.

3. The photoelectric conversion device according to claim 1, wherein the plurality of first main electrodes is electrically connected to each other by a wiring.

4. The photoelectric conversion device according to claim 1, wherein the plurality of first main electrodes is electrically independent of each other.

5. The photoelectric conversion device according to claim 1, wherein one of the plurality of first main electrodes is adjacent to two or more sides of the three or more sides of the gate.

6. The photoelectric conversion device according to claim 1, wherein the predetermined potential is a power supply potential.

7. The photoelectric conversion device according to claim 1, wherein charges are transferred from the plurality of photoelectric conversion units to the floating diffusion portion.

8. Equipment comprising:
    the photoelectric conversion device according to claim 1; and
    at least any one of:
    an optical device adapted for the photoelectric conversion device,
    a control device configured to control the photoelectric conversion device,
    a processing device configured to process a signal output from the photoelectric conversion device, a display device configured to display information obtained by the photoelectric conversion device, a storage device configured to store information obtained by the photoelectric conversion device, and a mechanical device configured to operate based on information obtained by the photoelectric conversion device.

9. The equipment according to claim 8, wherein the processing device processes image signals generated by a plurality of photoelectric conversion units, respectively, and acquires distance information on a distance from the photoelectric conversion device to an object.

10. The photoelectric conversion device according to claim 1, wherein in the plan view, an angle formed by a straight line that connects centers of two first main electrodes among the plurality of first main electrodes and a straight line that connects a center of one first main electrode among the two first main electrodes and a center of the second main electrode is an acute angle.

11. The photoelectric conversion device according to claim 1, wherein in the plan view, the second main electrode is arranged outside a region defined by all of virtual straight lines that pass through any two first main electrodes among the plurality of first main electrodes.

12. A light emitting device comprising:

a substrate;

a light emitting element; and a transistor arranged in the substrate, the transistor having a plurality of main electrodes and a gate, the transistor being configured to supply a current corresponding to a potential of the gate from at least one of the plurality of main electrodes to the light emitting element, wherein in a plan view with respect to the substrate, the gate has four or more sides, wherein in the plan view, the plurality of main electrodes is adjacent to three or more sides of the gate, wherein the plurality of main electrodes includes a second main electrode to which a predetermined potential is applied, and wherein the second main electrode is adjacent to only one of the three or more sides of the gate.

* * * * *